(12) United States Patent
Ookawa et al.

(10) Patent No.: US 6,797,888 B2
(45) Date of Patent: Sep. 28, 2004

(54) JUNCTION FLEXIBLE WIRING CIRCUIT BOARD

(75) Inventors: Tadao Ookawa, Osaka (JP); Yasuhito Ohwaki, Osaka (JP); Toshihiko Omote, Osaka (JP)

(73) Assignee: Nitto Denko Corporation, Osaka (JP)

( * ) Notice: Subject to any disclaimer, the term of this patent is extended or adjusted under 35 U.S.C. 154(b) by 91 days.

(21) Appl. No.: 10/053,555

(22) Filed: Jan. 24, 2002

(65) Prior Publication Data

US 2002/0100609 A1 Aug. 1, 2002

(30) Foreign Application Priority Data

Jan. 26, 2001 (JP) .................................... P. 2001-017864

(51) Int. Cl.⁷ ................................................. H05K 1/03
(52) U.S. Cl. ........................ 174/255; 174/254; 361/749
(58) Field of Search ................................ 174/254–263, 174/250; 361/749–750, 792–795, 748, 777–780; 360/244; 439/67, 77

(56) References Cited

U.S. PATENT DOCUMENTS

| 5,737,837 | A | * | 4/1998 | Inaba .......................... 174/254 |
| 5,857,257 | A | | 1/1999 | Inaba |
| 5,892,179 | A | * | 4/1999 | Rinne et al. ................. 174/261 |
| 5,961,334 | A | * | 10/1999 | Inaba ....................... 360/245.8 |
| 5,965,842 | A | | 10/1999 | Ganninger et al. |
| 6,252,176 | B1 | * | 6/2001 | Kuramochi et al. ......... 174/255 |
| 6,351,347 | B1 | * | 2/2002 | Ohno et al. .............. 360/244.1 |
| 6,524,892 | B1 | * | 2/2003 | Kishimoto et al. .......... 438/120 |

* cited by examiner

Primary Examiner—David Nelms
Assistant Examiner—Tuan Dinh
(74) Attorney, Agent, or Firm—Sughrue Mion, PLLC

(57) ABSTRACT

In a junction flexible wiring circuit board used for performing junction between a suspension board for mounting a magnetic head of a hard disk drive thereon and a control circuit board for operating the magnetic head, a metal layer is formed on at least one of a surface of an electrically insulating base layer and a surface of an electrically insulating cover layer.

12 Claims, 6 Drawing Sheets

JUNCTION FLEXIBLE WIRING CIRCUIT BOARD

BACKGROUND OF THE INVENTION

1. Field of the Invention

The present invention relates to a junction flexible wiring circuit board used for performing junction between a suspension board for mounting a magnetic head of a hard disk drive thereon and a control circuit board for operating the magnetic head.

2. Related Art

As shown in FIG. 12, there has been heretofore known a hard disk drive having a magnetic head 1, a suspension board 2 for mounting the magnetic head 1 thereon, a control circuit board 3 for operating the magnetic head 1, and a junction flexible wiring circuit board 4 for performing junction between the suspension board 2 and the control circuit board 3.

The magnetic head 1 is supported on a front end portion of the suspension board 2 while separated by a small gap from a magnetic disk (not shown) rotating at a high speed, so that the magnetic head 1 keeps a good floating posture against the stream of air produced in the gap.

The suspension board 2 is constituted by a circuit-provided suspension board which includes predetermined wiring circuit patterns 7 integrally formed on a metal substrate 5. More specifically, an electrically insulating base layer 6 made of polyimide or the like is formed on the metal substrate 5 made of stainless steel foil or the like. Predetermined wiring circuit patterns 7 made of copper foil or the like are formed on the electrically insulating base layer 6. The wiring circuit patterns 7 are covered with an electrically insulating cover layer 8. A magnetic head side connection terminal portion 9 for connecting the magnetic head 1 is formed in a front end portion of the suspension board 2. The magnetic head 1 is mounted on the suspension board 2 so as to be connected to the magnetic head side connection terminal portion 9. A junction flexible wiring circuit board side connection terminal portion 10 for connecting a suspension board side connection terminal portion 14 of the junction flexible wiring circuit board 4 which will be described hereunder is formed in a rear end portion of the suspension board 2.

The junction flexible wiring circuit board 4 is formed as follows. An electric conductor layer 12 made of copper foil or the like is formed as predetermined wiring circuit patterns on an electrically insulating base layer 11 made of polyimide or the like, and the electric conductor layer 12 is covered with an electrically insulating cover layer 13. The suspension board side connection terminal portion 14 for connecting the junction flexible wiring circuit board side connection terminal portion 10 of the suspension board 2 is formed in the front end of the junction flexible wiring circuit board 4. A control circuit board side connection terminal portion 15 for connecting a connection terminal portion 16 of the control circuit board 3 is formed in a rear end portion of the junction flexible wiring circuit board 4. The suspension board side connection terminal portion 14 is connected to the junction flexible wiring circuit board side connection terminal portion 10 of the suspension board 2 while the control circuit board side connection terminal portion 15 is connected to the connection terminal portion 16 of the control circuit board 3.

The frequency of signal transmission becomes higher and faster data transmission has been advanced in recent years. Therefore, Matching of characteristic impedance has been required on the whole of a signal transmission path composed of the magnetic head 1, the suspension board 2, the junction flexible wiring circuit board 4, and the control circuit board 3 in the hard disk drive.

Matching of characteristic impedance was, however, generated between the junction flexible wiring circuit board 4 and the suspension board 2 because characteristic impedance of the junction flexible wiring circuit board 4 was higher than that of the suspension board 2. Hence, signal reflection occurred in a junction portion between the junction flexible wiring circuit board 4 and the suspension board 2 and caused deterioration of transmission characteristic.

Therefore, it might be conceived that the line width and space width of these wiring circuit patterns were adjusted suitably to obtain characteristic impedance matching between the suspension board 2 and the junction flexible wiring circuit board 4. In practice, the wiring circuit patterns, however, must be formed in a limited space. It was difficult to obtain characteristic impedance matching in the above-mentioned method.

The present invention is devised upon such circumstances and an object of the present invention is to provide a junction flexible wiring circuit board adapted for high-frequency signal transmission so that characteristic impedance matching is obtained in a signal transmission path of a hard disk drive, especially between a suspension board and the junction flexible wiring circuit board by a simple configuration.

SUMMARY OF THE INVENTION

In order to achieve the above object, according to the present invention, there is provided a junction flexible wiring circuit board used for performing junction between a suspension board for mounting a magnetic head of a hard disk drive thereon and a control circuit board for operating the magnetic head, wherein the junction flexible wiring circuit board is provided with a metal layer formed as a front surface layer of the junction flexible wiring circuit board.

Further, according the present invention, preferably, the junction flexible wiring circuit board has a plurality of wiring circuit patterns disposed at intervals of a predetermined distance, and the metal layer is formed at least in a position opposite to the wiring circuit patterns. Further, preferably, a width of each of the wiring circuit patterns is not projected out from a width of the metal layer.

Further, preferably, a width of the metal layer is formed to be not smaller than a sum of a total width of the wiring circuit patterns and a total width of intervals between the wiring circuit patterns, and a width of each of the wiring circuit patterns is not projected out from the width of the metal layer.

Further, preferably, each of the wiring circuit patterns has at least one write line and at least one read line; the metal layer has a write line side metal layer portion opposite to all of the write lines, and a read line side metal layer portion disposed at a predetermined distance from the write line side metal layer portion so as to be opposite to all of the read lines.

In this case, preferably, a width of the write line side metal layer portion is formed to be not smaller than a sum of a total width of the write lines and a total width of intervals between the write lines, a width of each of the write lines portion is not projected out from the width of the write line side metal layer portion, a width of the read line side metal layer portion is formed to be not smaller than a sum of a total width of the read lines and a total width of intervals between the read lines, and a width of each of the read lines is not projected out from a width of the read line side metal layer portion.

BRIEF DESCRIPTION OF THE DRAWINGS

FIGS. 3A through 3E are longitudinal sectional views showing steps for producing the junction flexible wiring circuit board, in which FIG. 3A shows the step of preparing an electric conductor layer, FIG. 3B shows the step of forming a polyamic acid resin-film on the electric conductor layer, FIG. 3C shows the step of forming an electrically insulating base layer by hardening the film, FIG. 3D shows the step of forming the electric conductor layer into predetermined wiring circuit patterns by a subtractive method, and FIG. 3E shows the step of covering the electric conductor layer with an electrically insulating cover layer through an adhesive agent layer;

FIGS. 4A through 4C are longitudinal sectional views showing steps for producing the junction flexible wiring circuit board in succession to FIG. 3, in which FIG. 4A shows the step of forming an opening in the electrically insulating base layer in a front end potion of the junction flexible wiring circuit board and forming an opening in the electrically insulating cover layer in a rear end portion of the junction flexible wiring circuit board, FIG. 4B shows the step of forming a suspension board side connection terminal portion and a control circuit board side connection terminal portion, and FIG. 4C shows the step of forming a metal layer on a surface of the electrically insulating base layer;

DETAILED DESCRIPTION OF THE PREFERRED EMBODIMENTS

Figure 1:
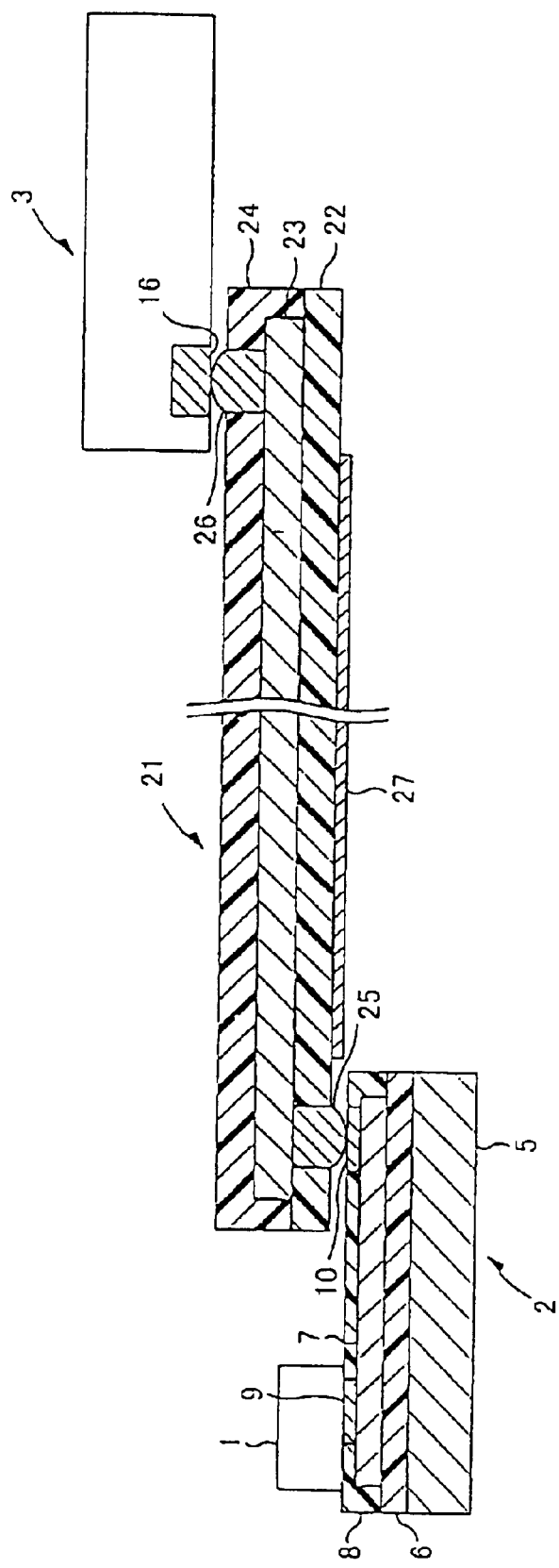
FIG. 1 is a longitudinal sectional view showing an embodiment of a junction flexible wiring circuit board according to the present invention.
Figure 2:
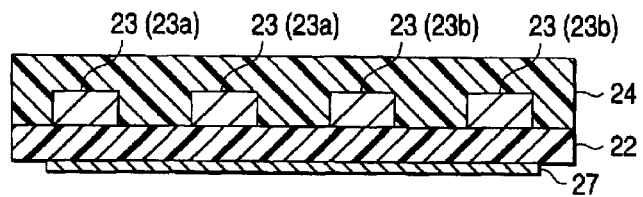
FIG. 2 is a transverse sectional view, perpendicular to the longitudinal direction, of the junction flexible wiring circuit board depicted in FIG. 1, showing a mode in which the width of a metal layer is set to be larger than the sum of the total width of wiring circuit patterns and the total width of intervals among the wiring circuit patterns.

FIG. 1 is a longitudinal sectional view showing an embodiment of a junction flexible wiring circuit board according to the present invention. FIG. 2 is a transverse sectional view, perpendicular to the longitudinal direction, of the junction flexible wiring circuit board. In FIG. 1, the junction flexible wiring circuit board 21 is used for performing junction between a suspension board 2 for mounting a magnetic head 1 of a hard disk drive thereon and a control circuit board 3 for operating the magnetic head 1.

As described above, the magnetic head 1 is supported on a front end portion of the suspension board 2 while separated by a small gap from a magnetic disk (not shown) rotating at a high speed so that the magnetic head 1 keeps a good floating posture against the stream of air produced in the gap.

As described above, for example, the suspension board 2 is constituted by a circuit-provided suspension board or the like which includes predetermined wiring circuit patterns 7 integrally formed on a metal substrate 5. More specifically, an electrically insulating base layer 6 made of polyimide or the like is formed on a metal substrate 5 made of stainless steel foil or the like. Predetermined wiring circuit patterns 7 made of copper foil or the like are formed on the electrically insulating base layer 6. The wiring circuit patterns 7 are covered with an electrically insulating cover layer 8. A magnetic head side connection terminal portion 9 for connecting the magnetic head 1 is formed in a front end portion of the suspension board 2 so as to face upward in the electrically insulating cover layer 8 side. The magnetic head 1 is mounted on the suspension board 2 so as to be connected to the magnetic head side connection terminal portion 9. A junction flexible wiring circuit board side connection terminal portion 10 for connecting a suspension board side connection terminal portion 25 of the junction flexible wiring circuit board 21 which will be described hereunder is formed in a rear end portion of the suspension board 2 so as to face upward in the electrically insulating cover layer 8 side.

As described above, a connection terminal portion 16 for connecting a control circuit board side connection terminal portion 26 of the junction flexible wiring circuit board 21 which will be described hereunder is also formed in a front end portion of a control circuit board 3 so as to face downward.

The junction flexible wiring circuit board 21 is basically formed as follows. An electric conductor layer 23 is formed as a plurality of wiring circuit patterns (line patterns) disposed at intervals of a predetermined distance on an electrically insulating base layer 22. The electric conductor layer 23 is covered with an electrically insulating cover layer 24.

More specifically, as shown in FIG. 2, the electric conductor circuit patterns of the electric conductor layer 23 have a plurality of (for example, two) write lines 23a for transmitting a write signal from the control circuit board 3 to the magnetic head 1, and a plurality of (for example, two) read lines 23b for transmitting a read signal from the magnetic head 1 to the control circuit board 3. The write lines 23a and the read lines 23b are disposed in parallel with one another at intervals of a predetermined distance. The respective write lines 23a are disposed in parallel with one another at intervals of a predetermined distance while the respective read lines 23b are disposed in parallel with one another at intervals of a predetermined distance. (That is, this electric conductor circuit patterns are formed as four line patterns having two write lines 23a and two read lines 23b disposed in parallel with one another at intervals of a predetermined distance.)

As shown in FIG. 1, the suspension board side connection terminal portion 25 for connecting the junction flexible wiring circuit board side connection terminal portion 10 of the suspension board 2 is formed in a lengthwise front end portion of the junction flexible wiring circuit board 21 so as to face downward in the electrically insulating base layer 22 side. The control circuit board side connection terminal portion 26 for connecting the connection terminal portion 16 of the control circuit board 3 is formed in a lengthwise rear end portion of the junction flexible wiring circuit board 21 so as to face upward in the electrically insulating cover layer 24 side.

A metal layer 27 is formed on the side of the junction flexible wiring circuit board 21 where the suspension board side connection terminal portion 25 is formed, that is, on a surface of the electrically insulating base layer 22 uniformly in the lengthwise direction except the front end portion where the suspension board side connection terminal portion 25 is formed and the rear end portion corresponding to the portion where the control circuit board side terminal portion 26 is formed. Characteristic impedance of a terminal-forming portion in each of the suspension board side connection terminal portion 25 and the control circuit board side connection terminal portion 26 is lower than that of each of the line portions formed as the electric conductor circuit patterns because the electric conductor layer 23 generally has a width (for example, hundreds of micrometers square) larger than the width of the line portion for the purpose of forming a soldering bump or the like. Hence, the metal layer 27 is not necessarily formed on the front and rear end portions of the junction flexible wiring circuit board 21.

The junction flexible wiring circuit board side connection terminal portion 10 of the suspension board 2 is connected to the suspension board side connection terminal portion 25 of the junction flexible wiring circuit board 21 in the condition that the suspension board 2 is disposed upward so as to face the electrically insulating base layer 22 in the front end portion of the junction flexible wiring circuit board 21. On the other hand, the connection terminal portion 16 of the control circuit board 3 is connected to the control circuit board side connection terminal portion 26 of the junction flexible wiring circuit board 21 in the condition that the control circuit board 3 is disposed downward so as to face the electrically insulating cover layer 24 in the rear end portion of the junction flexible wiring-circuit board 21.

A method of producing such a junction flexible wiring circuit board 21 will be described below.

As an electric insulator for forming the electrically insulating base layer 22 and the electrically insulating cover layer 24, synthetic resin which is generally used as an electric insulator in a flexible wiring circuit board may be used. Examples of the synthetic resin may include polyimide, polyether-nitrile, polyether-sulfone, polyethylene terephthalate, polyethylene naphthalate, polyvinyl chloride, etc. Especially, polyimide can be used preferably. The thickness of the electrically insulating base layer 22 is set to be generally in a range of from 5 to 100 μm, preferably in a range of from 8 to 50 μm. The thickness of the electrically insulating cover layer 24 is set to be generally in a range of from 5 to 100 μm, preferably in a range of from 8 to 50 μm.

As the electric conductor for forming the electric conductor layer 23, it is possible to use a metal or an alloy of the metal which is generally used as an electric conductor in a flexible wiring circuit board. Examples of the metal may include copper, nickel, gold, solder, etc. Especially, copper can be used preferably. The thickness of the electric conductor layer 23 is set to be generally in a range of from 5 to 50 μm, preferably in a range of from 8 to 35 μm.

The junction flexible wiring circuit board 21 can be produced as follows. First, the electrically insulating base layer 22 is formed by a known method such as a method of molding a dry film from an electric insulator. Then, the electric conductor layer 23 is formed as predetermined wiring circuit patterns on the electrically insulating base layer 22 by a known patterning method such as an additive method, a semi-additive method, a subtractive method, or the like. Then, the electrically insulating cover layer 24 is formed on the electric conductor layer 23 by a known method such as a method of laminating an electric insulator as a dry film. Thus, the junction flexible wiring circuit board 21 is produced.

The insulating base layer 22, the electric conductor layer 23 and the insulating cover layer 24 can be laminated as follows. The base layer 22 and/or the cover layer 24 may be laminated on the electric conductor layer 23 through an adhesive agent. Alternatively, the insulating base layer 22 and/or the insulating cover layer 24 may be formed directly on the electric conductor layer 23 by a method of applying a monomer solution such as a polyamic acid resin solution or the like onto the electric conductor layer 23 and drying the monomer solution to harden it as a film.

Then, openings are formed in the electrically insulating base layer 22 in the front end portion of the junction flexible wiring circuit board 21 as well as in the electrically insulating cover layer 24 in the rear end portion thereof by a known perforating method such as a drilling method, a laser ablation method, a chemical etching method, a plasma etching method or the like, so that the electric conductor layer 23 is exposed. Then, the suspension board side connection terminal portion 25 and the control circuit board side connection terminal portion 26 are formed in the openings respectively by a method such as gold plating, nickel plating, chromium plating, solder plating or the like.

In the formation of the insulating base layer 22 and the electrically insulating cover layer 24 from a monomer solution such as a polyamic acid resin solution or the like, photosensitive films can be formed when, for example, a photosensitive material such as a 1,4-dihydropyridine derivative or the like is mixed with the monomer solution. Hence, when the photosensitive films are exposed to light and developed by photolithography, the formation of the opening portions for forming the suspension board side connection terminal portion 25 and the control circuit board side connection terminal portion 26 can be made simultaneously with the formation of the insulating base layer 22 and the electrically insulating cover layer 24.

Then, the metal layer 27 is formed on a surface of the insulating base layer 22 of the junction flexible wiring circuit board 21 obtained in the aforementioned manner. The metal layer 27 is formed to thereby adjust the characteristic impedance of the flexible wiring circuit board 21 but need not have mechanical strength as high as that required of the metal substrate 5 of the suspension board 2. Therefore, the method of forming the metal layer 27 is not particularly limited. For example, the metal layer 27 can be formed by a known method such as sputtering, evaporation, plating or the like. Alternatively, the metal layer 27 may be formed by sticking a metal thin plate to the base layer 22 through an adhesive agent.

When sputtering or evaporation is used, the metal layer 27 can be formed as a layer of a metal such as copper, chromium, nickel, gold or the like. Either electroplating or electroless plating may be used as plating. In this case, the metal layer 27 can be formed as a layer of a metal such as copper, chromium, nickel, gold, solder or the like.

When a metal thin plate is adhered, a sheet of foil or a thin plate of a metal or alloy such as copper, chromium, nickel, gold, silver, aluminum, stainless steel, 42 alloy or the like can be used as the metal thin plate. For example, the metal thin plate may be adhered to the base layer 22 through an adhesive agent such as a thermoplastic polyimide adhesive agent or the like.

As described above, the metal layer 27 is preferably formed uniformly in the lengthwise direction except the front end portion where the suspension board side connection terminal portion 25 and the rear end portion corresponding to the portion where the control circuit board side connection terminal portion 26 is formed.

The thickness of the metal layer 27 is set to be generally in a range of from 100 Å to 50 μm, preferably in a range of from 500 Å to 30 μm.

To obtain characteristic impedance matching between the suspension board 2 and the junction flexible wiring circuit board 21, specifically, the thickness of the electrically insulating base layer 22 or cover layer 24 held between the metal layer 27 and the electric conductor layer 23 (including the thickness of the reinforcement plate 29, the adhesive agent layer 30 or the like if the reinforcement plate 29 is provided as will be descried later) may be set suitably in consideration of the wiring circuit patterns of the electric conductor layer 23. Accordingly, the characteristic impedance of the junction flexible wiring circuit board 21 is preferably set so that the difference between the characteristic impedance of the junction flexible wiring circuit board 21 and the characteristic impedance of the suspension board 2 is within a range of ±10%.

Because the junction flexible wiring circuit board 21 has the metal layer 27 in the same manner as the suspension board 2 has the metal substrate 5, the characteristic impedance of the junction flexible wiring circuit board 21 can be set to be nearer to or preferably substantially equal to that of the suspension board 2.

Hence, characteristic impedance matching between the suspension board 2 and the junction flexible wiring circuit board 21 can be achieved by a simple configuration in which the metal layer 27 is formed on the junction flexible wiring circuit board 21, so that high-frequency signal transmission characteristic can be improved.

The characteristic impedance of the junction flexible wiring circuit board 21 is also preferably set to be as near to that of the magnetic head 1 and the control circuit board 3 as possible. Therefore, the characteristic impedance of the junction flexible wiring circuit board 21 is preferably set so that the difference between the characteristic impedance of the junction flexible wiring circuit board 21 and the characteristic impedance of the magnetic head 1 and the control circuit board 3 is within the range of ±10%. More specifically, the characteristic impedance of the junction flexible wiring circuit board 21 is set to be generally lower than 100 Ω, preferably lower than 80 Ω.

Hence, characteristic impedance matching can be attained on the whole of the signal transmission path formed by the magnetic head 1, the suspension board 2, the junction flexible wiring circuit board 21 and the control circuit board 3 in the hard disk drive, so that high-frequency signal transmission characteristic can be improved more greatly.

Figure 3A:
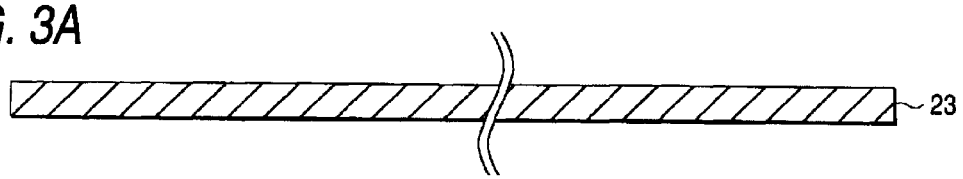
Figure 3B:
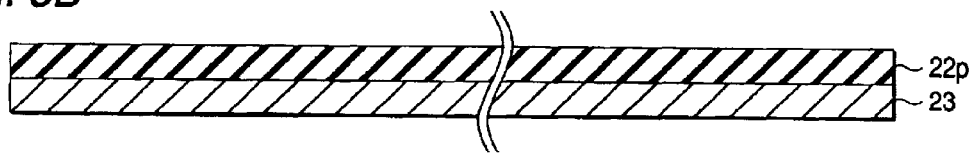
Figure 3C:
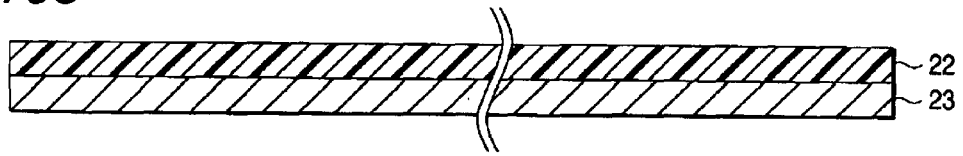

More preferably, such a junction flexible wiring circuit board 21 can be produced as follows. That is, for example, as shown in FIG. 3A, first, a sheet of metal foil or a metal thin plate made of copper or the like is prepared as the electric conductor layer 23. As shown in FIG. 3B, a polyamic acid resin solution is applied onto the electric conductor layer 23 by a known method such as spin coating or bar coating and then dried by hot air at a temperature in a range of from 50 to 120° C. to thereby form a film 22p. As shown in FIG. 3C, the film 22p is heated, for example, at a temperature in a range of from 300 to 500° C. so as to be hardened (imidized) to thereby form an electrically insulating base layer 22 of polyimide. In this manner, a two-layer base member having the electric conductor layer 23, and the electrically insulating base layer 22 directly formed on the electric conductor layer 23 is obtained.

Figure 3D:
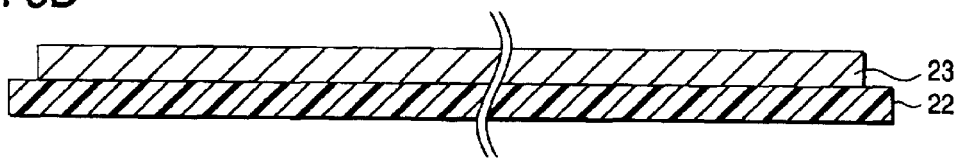
Figure 3E:
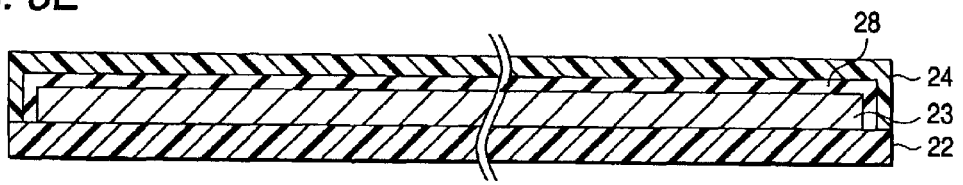

As shown in FIG. 3D, the electric conductor layer 23 of the two-layer base member is then formed into predetermined wiring circuit patterns by a subtractive method. As shown in FIG. 3E, the electric conductor layer 23 is then covered with an electrically insulating cover layer 24 of a polyimide film through an adhesive agent layer 28 of a thermoplastic polyimide adhesive agent or the like. Thus, a junction flexible wiring circuit board 21 is produced. As described above, the wiring circuit patterns are formed as four line patterns having two write lines 23a and two read lines 23b disposed in parallel with one another at intervals of a predetermined distance. The thickness of the adhesive agent layer 28 is set to be generally in a range of from 5 to 80 μm, preferably in a range of from 8 to 50 μm. Incidentally, FIGS. 3D and 3E are turned upside down with respect to FIGS. 3A to 3C.

Figure 4A:
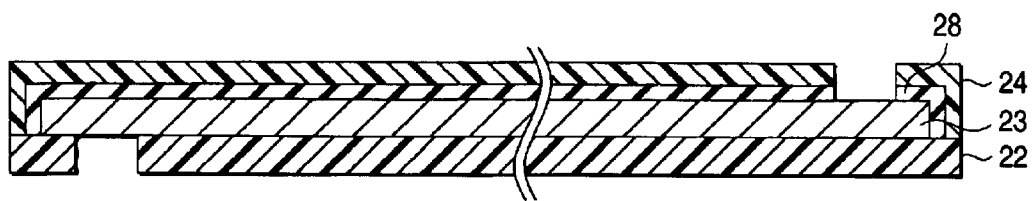
Figure 4B:
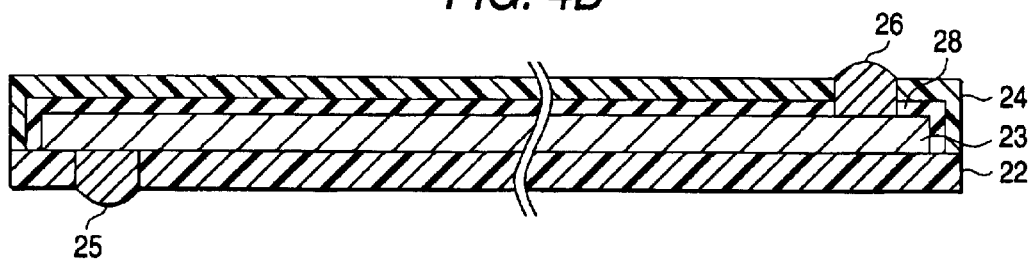
Figure 4C:
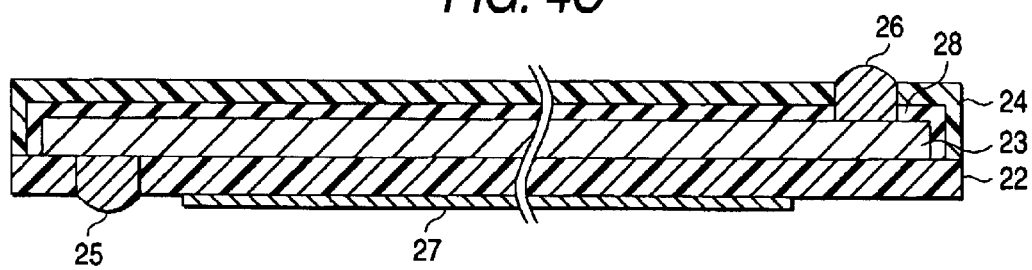

Then, as shown in FIG. 4A, an opening is formed in the electrically insulating base layer 22 in the front end portion of the junction flexible wiring circuit board 21 by a known perforating method to expose a part of the electric conductor layer 23 whereas an opening is formed in the electrically insulating cover layer 24 in the rear end portion of the junction flexible wiring circuit board 21 by a known perforating method to expose a part of the electric conductor layer 23. Then, as shown in FIG. 4B, a suspension board side connection terminal portion 25 and a control circuit board side connection terminal portion 26 are formed on these exposed portions respectively by a method such as plating or the like. Then, as shown in FIG. 4C, chromium, copper, etc. are successively sputtered onto a surface of the electrically insulating base layer 22 except the front end portion where the suspension board side connection terminal portion 25 is formed and the rear end portion corresponding to the portion where the control circuit board side connection terminal portion 26 is formed. In this manner, a metal layer 27 can be formed.

The metal layer 27 may be formed before the suspension board side connection terminal portion 25 and the control circuit board side connection terminal portion 26 are formed (that is, before the step shown in FIG. 4A or before the step shown in FIG. 4B.

If the metal layer 27 is formed in a position opposite to the respective wiring circuit patterns, the characteristic impedance of the junction flexible wiring circuit board 21 can be reduced. To reduce the characteristic impedance more effectively, it is preferable that the metal layer 27 is disposed opposite to the respective wiring circuit patterns and the width of each of the wiring circuit patterns is not projected out from the width of the metal layer 27 (in other words, the respective wiring circuit patterns are disposed within the width of the metal layer 27).

More specifically, as shown in FIG. 2, the junction flexible wiring circuit board 21 is formed so that the width of the metal layer 27 is equal to or larger than the sum of the total width of all the wiring circuit patterns (that is, the sum of the total width of the two write lines 23a and the total width of the two read lines 23b) and the total width of all the intervals among the wiring circuit patterns (that is, the sum of the width of the space between the write lines 23a, the width of the space between a write line 23a and a read lines 23b adjacent to each other and the width of the space between the read lines 23b) (in other words, the sum of the total width of the four lines and the total-width of the three spaces). Moreover, the junction flexible wiring circuit board 21 is formed so that the width of each of the wiring circuit patterns is not projected out from the width of the metal layer 27.

Figure 5:
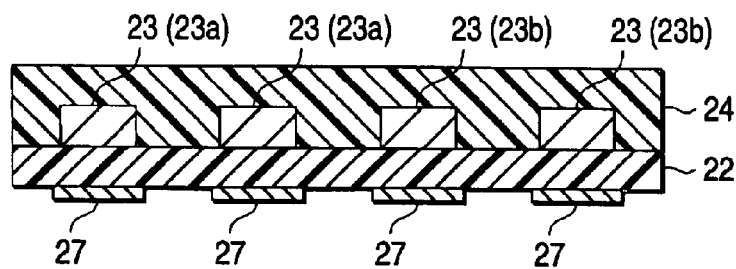
FIG. 5 is a transverse sectional view, perpendicular to the longitudinal direction, of the junction flexible wiring circuit board in which metal layer portions are formed in positions opposite to the wiring circuit patterns respectively.

Alternatively, for example, as shown in FIG. 5, the metal layer 27 may be provided as a plurality of metal layer portions formed in positions opposite to the wiring circuit patterns respectively to make it possible to reduce characteristic impedance. That is, in FIG. 5, the metal layer 27 is provided as four lines which are formed on a surface of the electrically insulating base layer 22 so as to be opposite to the two write lines 23a and the two read lines 23b and which are formed uniformly in the lengthwise direction at intervals of a predetermined distance so that the width of each of the write lines 23a and read lines 23b is not projected out from the width of corresponding one of the metal layer portions 27.

Figure 6:
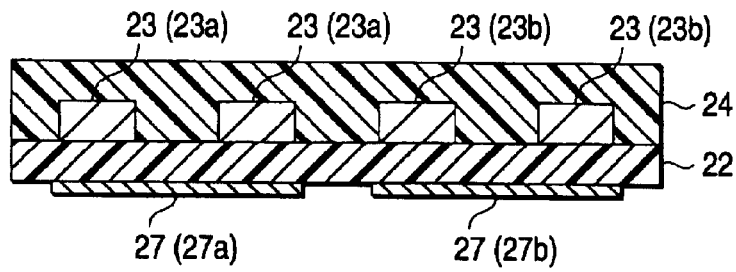
FIG. 6 is a transverse sectional view, perpendicular to the longitudinal direction, of the junction flexible wiring circuit board in which a write line side metal layer portion opposite to write lines and a read line side metal layer portion opposite to read lines are formed in combination as a metal layer at a predetermined distance from each other.

Alternatively, as shown in FIG. 6, the metal layer 27 may be provided as a combination of a write line side metal layer portion 27a and a read line side metal layer portion 27b which are formed at a predetermined distance from each other so that the write line side metal layer portion 27a faces the two write lines 23a while the read line side metal layer portion 27b faces the two read lines 23b. That is, in FIG. 6, the write line side metal layer portion 27a is formed uniformly in the lengthwise direction so that the width of the write line side metal layer portion 27a is equal to or larger than the sum of the total width of the two write lines 23a and the width of the space between the write lines 23a and so that the width of each of the write lines 23a is not projected out from the width of the write line side metal layer portion 27a.

Similarly, the read line side metal layer portion 27b is formed uniformly in the lengthwise direction so that the width of the read line side metal layer portion 27b is equal to or larger than the sum of the total width of the two read lines 23b and the width of the space between the read lines 23b and so that the width of each of the read lines 23b is not projected out from the width of the read line side metal layer portion 27b.

The write line side metal layer portion 27a and the read line side metal layer portion 27b are formed at a predetermined distance from each other.

When the metal layer 27 is provided as a combination of the write line side metal layer portion 27a and the read line side metal layer portion 27b formed at a predetermined distance from each other in the aforementioned manner, transmission signal crosstalk can be prevented from occurring between the write lines 23a and the read lines 23b.

Figure 7:
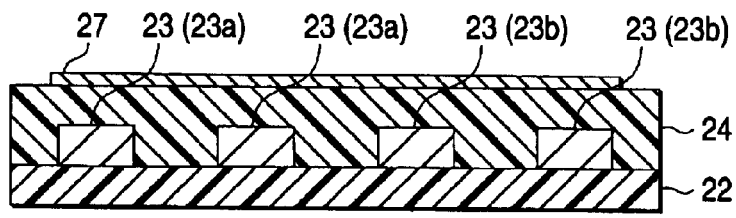
FIG. 7 is a transverse sectional view, perpendicular to the longitudinal direction, of the junction flexible wiring circuit board in which a metal layer is formed on a surface of an electrically insulating cover layer.

In the junction flexible wiring circuit board 21, the metal layer 27 may be formed either on a surface of the electrically insulating base layer 22 or on a surface of the electrically insulating cover layer 24. For example, as shown in FIG. 7, the metal layer 27 may be also formed on a surface of the electrically insulating cover layer 24 in accordance with the purpose, application, etc. of the junction flexible wiring circuit board 21. When the metal layer 27 is formed on a surface of the electrically insulating cover layer 24, the metal layer 27 is formed uniformly in the lengthwise direction, for example, except the rear end portion where the control circuit board side connection terminal portion 26 is formed and the front end portion corresponding to the portion where the suspension board side connection terminal portion 25 is formed though the connection terminal portions 26 and 25 are not shown in FIG. 7.

Figure 8:
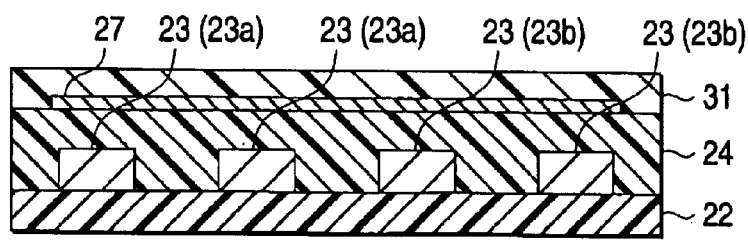
FIG. 8 is a transverse sectional view, perpendicular to the longitudinal direction, of the junction flexible wiring circuit board in which a second electrically insulating cover layer is further formed on a surface of the metal layer of the junction flexible wiring circuit board depicted in FIG. 7.

Further, as shown in FIG. 8, a second electrically insulating cover layer 31 may be formed on a surface of the metal layer 27 formed on the electrically insulating cover layer 24. When the second cover layer 31 is formed, the widthwise opposite end portions of the metal layer 27 may be preferably formed slightly inwardly from the widthwise opposite end portions of the electrically insulating cover layer 24 so that the whole surface of the metal layer 27 can be covered with the second electrically insulating cover layer 31.

Figure 9:
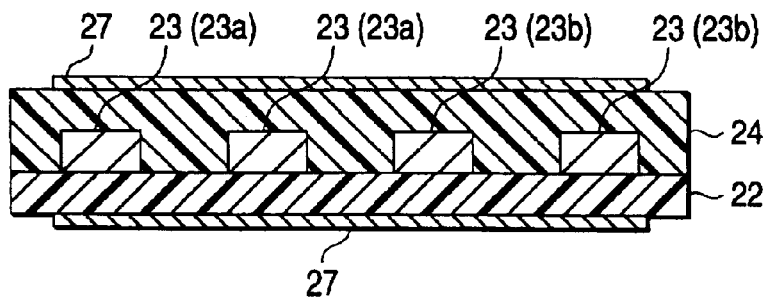
FIG. 9 is a transverse sectional view, perpendicular to the longitudinal direction, of the junction flexible wiring circuit board in which metal layers are formed on opposite surfaces, that is, on a surface of an electrically insulating base layer and on a surface of an electrically insulating cover layer respectively.
Figure 10:
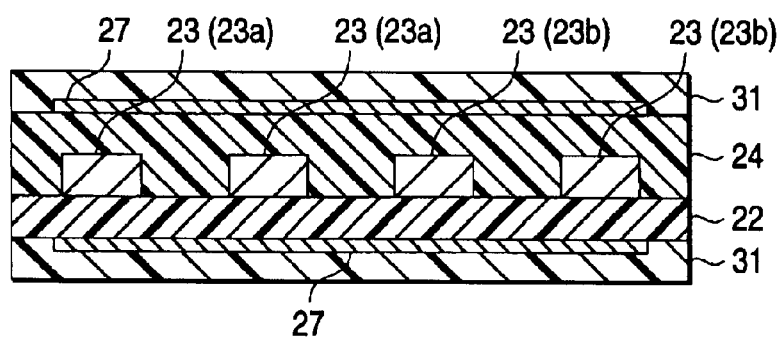
FIG. 10 is a transverse sectional view, perpendicular to the longitudinal direction, of the junction flexible wiring circuit board in which second electrically insulating cover layers are further formed on opposite surfaces of the metal layers of the junction flexible wiring circuit board depicted in FIG. 9.

Further, as shown in FIG. 9, metal layers 27 may be formed on a surface of the electrically insulating base layer 22 and on a surface of the electrically insulating cover layer 24 respectively in accordance with the necessity. As shown in FIG. 10, second electrically insulating cover layers 31 may be formed on respective surfaces of the metal layers 27 formed on the surfaces of the electrically insulating base layer 22 and cover layer 24. In each of these cases, the widthwise opposite end portions of each of the metal layers 27 may be preferably formed slightly inwardly from the widthwise opposite end portions of corresponding one of the electrically insulating base layer 22 and cover layers 24 so that the whole surface of each of the metal layers 27 can be covered with corresponding one of the second electrically insulating cover layers 31.

Figure 11:
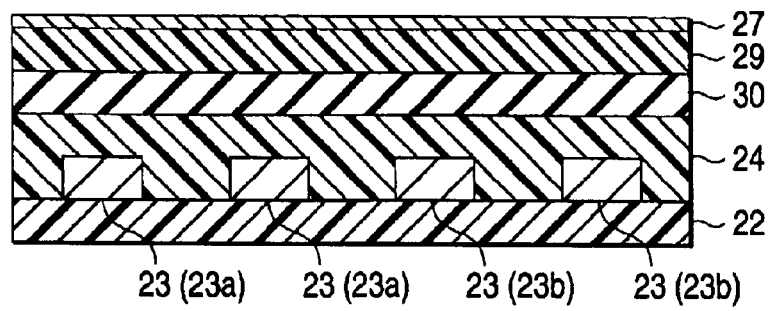
FIG. 11 is a transverse sectional view, perpendicular to the longitudinal direction, of the junction flexible wiring circuit board in a mode in which a metal layer is formed on a reinforcement plate laminated on an electrically insulating cover layer through an adhesive agent layer.
Figure 12:
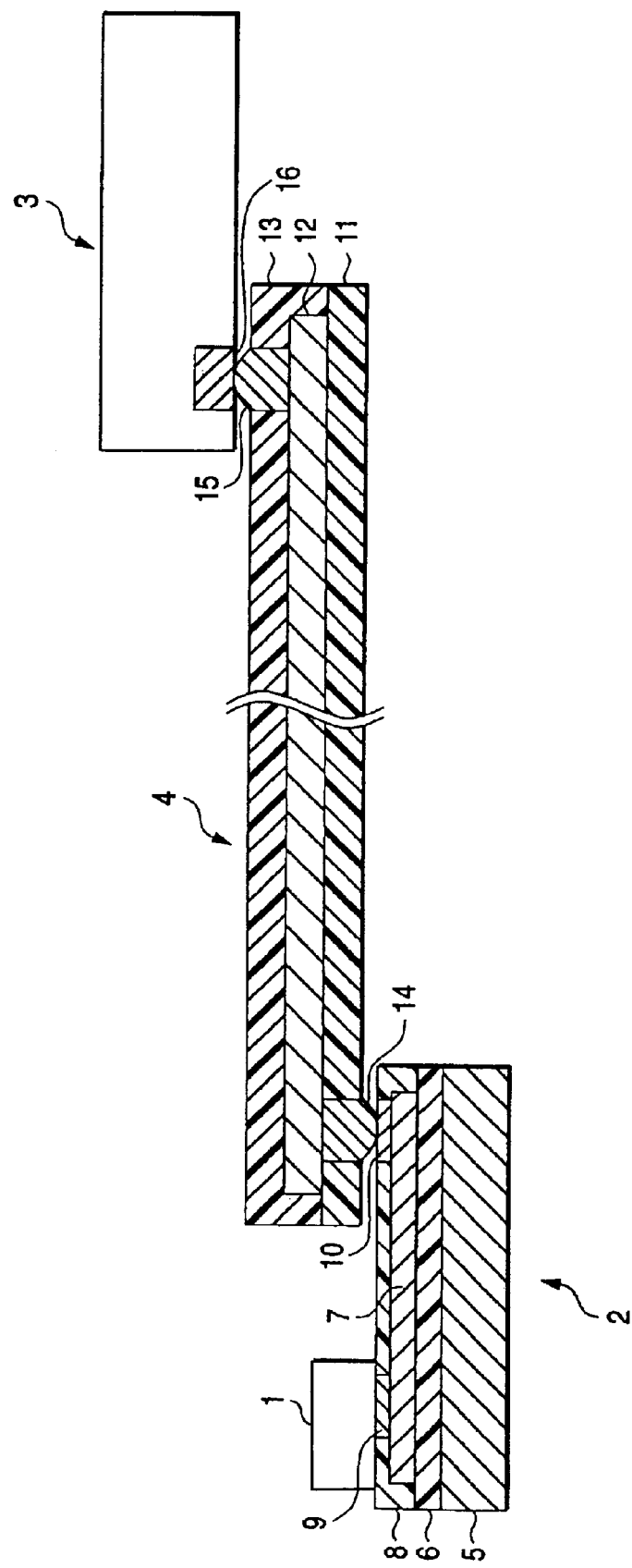
FIG. 12 is a longitudinal sectional view showing a junction flexible wiring circuit board of related art.

In such a junction flexible wiring circuit board 21, a reinforcement plate 29 may be laminated on at least one of the electrically insulating base layer 22 and cover layer 24 in accordance with the purpose and application of the junction flexible wiring circuit board 21. For example, FIG. 11 shows a mode in which a reinforcement plate 29 is laminated on the electrically insulating cover layer 24 through an adhesive agent layer 30 and in which a metal layer 27 is formed on the reinforcement plate 29. Lamination of the reinforcement plate 29 permits improvement in mechanical strength of the junction flexible wiring circuit board 21. Although the material of the reinforcement plate 29 is not particularly limited, for example, the aforementioned synthetic resin film may be used. Further, the thickness of the reinforcement plate 29 is set preferably to be in a range of from 5 to 100 $\mu$m, more preferably in a range of from 8 to 50 $\mu$m. The same adhesive agent as described above may be used as the adhesive agent layer 30 through which the reinforcement plate 29 is adhered to the electrically insulating cover layer 24. The thickness of the adhesive agent layer 30 is set preferably to be in a range of from 5 to 80 μm, more preferably in a range of from 8 to 50 μm.

In such a junction flexible wiring circuit board 21, a metal layer 27 made of a sheet of foil such as stainless steel foil or the like, or made of a metal thin plate may be prepared in the same manner as that described in the method of producing the suspension board 2 so that the electrically insulating base layer 22, the electric conductor layer 23 and the electrically insulating cover layer 24 can be formed successively on the metal layer 27.

EXAMPLE

Although the present invention will be described below more specifically in connection with the following example and comparative example, the present invention is not limited to the example and comparative example at all.
1) Production of Junction Flexible Wiring Circuit Board Example 1

A sheet of copper foil 18 μm thick was prepared as an electric conductor layer. A polyamic acid resin solution was applied onto the copper foil and dried to be hardened. Thus, an electrically insulating base layer of polyimide 25 μm thick was formed directly on the copper foil (two-layer base member). Then, after the copper foil was formed into predetermined wiring circuit patterns by a subtractive method, an electrically insulating cover layer of a polyimide film 12.5 μm thick was formed on the wiring circuit patterns through a thermoplastic polyimide adhesive agent layer 10 μm thick. Next, a reinforcement plate of a polyimide film 25 μm thick was laminated on the electrically insulating cover layer through a thermoplastic polyimide adhesive agent layer 30 μm thick. Then, a chromium thin film 300 Å thick and a copper thin film 700 Å thick were formed successively on the reinforcement plate by sputtering to thereby form a metal layer. Thus, a junction flexible wiring circuit board A was produced. The junction flexible wiring circuit board A corresponds to the mode shown in FIG. 11.

Comparative Example 1

A junction flexible wiring circuit board B was produced in the same manner as that in Example 1 except that the metal layer was not formed.
2) Production of Suspension Board A polyamic acid resin solution was applied onto a metal substrate of stainless steel foil 25 μm thick and dried to be hardened. Thus, an electrically insulating base layer of polyimide 10 μm thick was formed on the metal substrate. Then, wiring circuit patterns of copper foil 10 μm thick were formed on the electrically insulating base layer by a semi-additive method. Then, a polyamic acid resin solution was further applied onto the copper foil and dried to be hardened to thereby form an electrically insulating cover layer of polyimide 3 μm thick. Thus, a suspension board was produced.
3) Evaluation The junction flexible wiring circuit board A, the junction flexible wiring circuit board B and the suspension board obtained in the above description were measured as to characteristic impedance by a time-domain reflectometry (TDR) method. Results were as follows.

Junction flexible wiring circuit board A: 75 Ω
Junction flexible wiring circuit board B: 90 Ω
Suspension board: 75 Ω

As described above, in the junction flexible wiring circuit board according to the present invention, characteristic impedance matching between the junction flexible wiring circuit board and the suspension board can be achieved by a simple configuration in which a metal layer is formed in a surface of the junction flexible wiring circuit board. Hence, high-frequency signal transmission characteristic can be improved.

What is claimed is:

1. A junction flexible wiring circuit board used for performing junction between a suspension board for mounting a magnetic head thereon and a control circuit board for operating said magnetic head, said junction flexible wiring circuit board comprising:
   a metal layer formed as a front surface layer of said junction flexible wiring circuit board,
   wherein said metal layer is formed substantially uniformly in the lengthwise direction except portions where terminal portions are provided and wherein further, said metal layer does not contact the terminal portions.

2. A junction flexible wiring circuit board according to claim 1, further comprising:
   a plurality of wiring circuit patterns disposed at intervals of a predetermined distance;
   wherein said metal layer is formed at least in a position opposite to said wiring circuit patterns.

3. A junction flexible wiring circuit board according to claim 1, wherein said metal layer is formed at least on a side of said junction flexible wiring circuit board on which the terminal portions connected to said suspension board are provided.

4. A junction flexible wiring circuit board according to claim 1, wherein a thickness of the metal layer is in a range from 100 angstroms to 50 μm.

5. A junction flexible wiring circuit board according to claim 1, wherein a thickness of the metal layer is in a range from 500 angstroms to 30 μm.

6. A junction flexible wiring circuit board according to claim 2, wherein a width of each of said wiring circuit patterns is not projected out from a width of said metal layer.

7. A junction flexible wiring circuit board according to claim 2, wherein a width of said metal layer is formed to be not smaller than a sum of a total width of said wiring circuit patterns and a total width of intervals between said wiring circuit patterns; and
   a width of each of said wiring circuit patterns is not projected out from the width of said metal layer.

8. A junction flexible wiring circuit board according to claim 2, wherein each of said wiring circuit patterns is provided with at least one of write line and at least one of read line; and
   said metal layer includes a write line side metal layer portion opposite to all of said write lines, and a read line side metal layer portion disposed at a predetermined distance from said write line side metal layer portion so as to be opposite to all of said read lines.

9. A junction flexible wiring circuit board according to claim 3, wherein metal layers, including the metal layer formed on the side of said junction flexible wiring circuit board on which the terminal portions connected to said suspension board are provided, are formed on both of two sides of said junction flexible wiring circuit board.

10. A junction flexible wiring circuit board according to claim 8, wherein:
   a width of said write line side metal layer portion is formed to be not smaller than a sum of a total width of said write lines and a total width of intervals between said write lines;

a width of each of said write lines portion is not projected out from the width of said write line side metal layer portion;

a width of said read line side metal layer portion is formed to be not smaller than a sum of a total width of said read lines and a total width of intervals between said read lines; and a width of each of said read lines is not projected out from a width of said read line side metal layer portion.

11. A junction flexible wiring circuit board provided in combination with a suspension board for mounting a magnetic head thereon and a control circuit board for operating said magnetic head, comprising:

a metal layer formed as a front surface layer of said junction flexible wiring circuit board; and a characteristic impedance of said junction flexible wiring circuit board being within ±10% of a characteristic impedance of said suspension board and within ±10% of a characteristic impedance of said control circuit board, wherein said metal layer is formed in the lengthwise direction without being in contact with terminal portions provided on the junction flexible wiring circuit board.

12. A junction flexible wiring circuit board provided in combination with a suspension board and a control circuit board according to claim 11, wherein the metal layer is disposed on the junction flexible wiring circuit board in a same manner as a metal layer disposed on the suspension board so that the characteristic impedance of the junction flexible wiring circuit board and the suspension board are substantially equal.

* * * * *